United States Patent
Ok

(10) Patent No.: US 9,214,956 B2
(45) Date of Patent: Dec. 15, 2015

(54) SEMICONDUCTOR DEVICE, MULTICHIP PACKAGE AND SEMICONDUCTOR SYSTEM USING THE SAME

(71) Applicant: SK hynix Inc., Gyeonggi-do (KR)

(72) Inventor: Sung-Hwa Ok, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 45 days.

(21) Appl. No.: 14/085,436

(22) Filed: Nov. 20, 2013

(65) Prior Publication Data

US 2014/0380136 A1    Dec. 25, 2014

(30) Foreign Application Priority Data

Jun. 19, 2013  (KR) .................. 10-2013-0070379

(51) Int. Cl.
| | |
|---|---|
| *G06F 11/10* | (2006.01) |
| *H03M 13/00* | (2006.01) |
| *H03M 13/09* | (2006.01) |
| *G11C 29/04* | (2006.01) |

(52) U.S. Cl.
CPC ........... *H03M 13/09* (2013.01); *G06F 11/1004* (2013.01); *G11C 2029/0411* (2013.01)

(58) Field of Classification Search
CPC ........... H03M 13/09; H03M 13/1102; H03M 13/2957; H03M 13/1515; H03M 13/152; H03M 13/19; H03M 13/15; H03M 13/33; G11C 2029/0411; G06F 13/4243; G06F 13/1668; G06F 11/1004; H04N 7/1675; H04N 21/43853; H04N 21/42623; H04B 14/068

See application file for complete search history.

(56) References Cited

U.S. PATENT DOCUMENTS

| | | | | |
|---|---|---|---|---|
| 4,481,648 A * | 11/1984 | Fujii | ............................ | 375/373 |
| 4,641,309 A * | 2/1987 | Nakano et al. | ................. | 714/747 |
| 4,853,798 A * | 8/1989 | Fukuju et al. | .................. | 386/271 |
| 5,787,132 A * | 7/1998 | Kishigami et al. | ............ | 375/354 |
| 6,005,789 A * | 12/1999 | Lee | .................. | 363/95 |
| 6,959,059 B1 * | 10/2005 | Yamazaki | ...................... | 375/368 |
| 7,391,813 B2 * | 6/2008 | Shinsho | ........................ | 375/242 |
| 2004/0078737 A1* | 4/2004 | Miyamoto | .................... | 714/700 |
| 2005/0268199 A1* | 12/2005 | Tseng et al. | ................... | 714/746 |
| 2008/0028177 A1* | 1/2008 | Bartley et al. | ................. | 711/167 |
| 2008/0040529 A1* | 2/2008 | Bartley et al. | ................. | 710/307 |
| 2008/0163007 A1* | 7/2008 | Shaeffer et al. | ................. | 714/52 |
| 2010/0031129 A1* | 2/2010 | Hargan | ......................... | 714/786 |
| 2010/0088515 A1* | 4/2010 | Nishimoto et al. | ............ | 713/168 |
| 2011/0022665 A1* | 1/2011 | Pinto et al. | .................... | 709/206 |

FOREIGN PATENT DOCUMENTS

| | | |
|---|---|---|
| KR | 100882484 | 2/2009 |
| KR | 1020120004177 | 1/2012 |
| KR | 1020120095221 | 8/2012 |

* cited by examiner

*Primary Examiner* — Guerrier Merant
(74) *Attorney, Agent, or Firm* — IP & T Group LLP

(57) ABSTRACT

A semiconductor device includes an error detection unit suitable for receiving data and a cyclic redundancy check (CRC) code, and for outputting a detection signal by detecting a transmission error of the data, and a signal change unit suitable for generating error information based on the detection signal while changing a signal form of the error information based on a signal transmission environment of the data.

15 Claims, 5 Drawing Sheets

SEMICONDUCTOR DEVICE, MULTICHIP PACKAGE AND SEMICONDUCTOR SYSTEM USING THE SAME

CROSS-REFERENCE TO RELATED APPLICATIONS

The present application claims priority of Korean Patent Application No. 10-2013-0070379, filed on Jun. 19, 2013, which is incorporated herein by reference in its entirety.

BACKGROUND

1. Field

Exemplary embodiments of the present invention relate to a semiconductor design technology, and more particularly, to a semiconductor device, a multichip package, and a semiconductor system using the same for detecting a data transmission error and transmitting a detected result.

2. Description of the Related Art

In general, a semiconductor device such as a double data rate synchronous dynamic random access memory (DDR SDRAM) receives data from an external controller and performs a plurality of operations. However, in case that an error occurs in a data transmission, the semiconductor device receives erroneous data, and this may deteriorate the reliability of the semiconductor devices. Recently, as a data processing speed of the semiconductor device is increased, the amount of data received from the external controller is increased and a transmission speed is increased. As a result, the number of errors, which occur in the data transmission, may be increased. Thus, schemes for overcoming the above-described problem have been developed. One of the schemes is to use a cyclic redundancy check code (CRC) code.

The CRC code is generated based on data to be transmitted from the external controller. The external controller transmits the data with the CRC code to the semiconductor device. Subsequently, the semiconductor device performs an operation based on the CRC code and the data transmitted from the external device, and generates an operated result. An error, which occurs during a data transmission, may be detected using the operated result.

FIG. 1 is a block diagram illustrating a conventional semiconductor device.

As shown in FIG. 1, a semiconductor device includes a controller 110 and a semiconductor device 120.

The controller 110 transmits data DAT and a CRC code corresponding to the data DAT to the semiconductor device 120. The semiconductor device 120 performs an operation based on the CRC code and the data DAT, and detects an error, which occurs in a data transmission. The semiconductor device 120 transmits detected error information INF_ERR to the controller 110. The controller 110 determines whether or not an error occurred in the data transmission based on the detected error information INF_ERR. If the error occurred in the data transmission, the controller 110 re-transmits the data to the semiconductor device 120.

Recently, a semiconductor device has been developed in view of a manufacturing process or a design technology thereof. As a result, a size of a semiconductor device has been minimized and a power consumption has been lowered while an operation speed of a semiconductor device has been increased. Such a development of a semiconductor device provides an environment for operating more data with a less consumed power. However, since such a low power at a high speed may cause a noise to an operation of a semiconductor device, a complementary technology to the noise is needed.

SUMMARY

Exemplary embodiments of the present invention are directed to a semiconductor device, a multichip package, and a semiconductor system using the same for detecting an error in a data transmission and transmitting a detected result stably.

In accordance with an exemplary embodiment of the present invention, a semiconductor device includes an error detection unit suitable for receiving data and a cyclic redundancy check (CRC) code, and for outputting a detection signal by detecting a transmission error of the data, and a signal change unit suitable for generating error information based on the detection signal while changing a signal form of the error information based on a signal transmission environment of the data.

In accordance with an exemplary embodiment of the present invention, a semiconductor system includes a plurality of semiconductor devices suitable for receiving data and a cyclic redundancy check (CRC) code corresponding to the data, for detecting a transmission error of the data, and for generating error information, a controller suitable for providing the data and the CRC code to the semiconductor devices, for receiving the error information through a common transmission line, and for re-transmitting the data, and a loading value detection unit suitable for detecting a loading value of the common transmission line, and generating a control signal, wherein each of the semiconductor devices change a signal form of the error information in response to the control signal.

In accordance with an exemplary embodiment of the present invention, a multichip package having a plurality of semiconductor chips coupled to through-silicon-vias (TSVs), each semiconductor chip includes an error detection unit suitable for receiving data and a cyclic redundancy check (CRC) code, and outputting a detection signal by detecting a transmission error of the data, a chip identification (ID) generation unit suitable for generating a chip ID corresponding to each semiconductor chip, a chip ID comparison unit suitable for generating a control signal by comparing a predetermined chip ID with the chip ID generated by the chip ID generation unit, and a pulse generation unit suitable for generating error information based on the detection signal while changing a signal form of the error information in response to the control signal.

DETAILED DESCRIPTION

Figure 1:
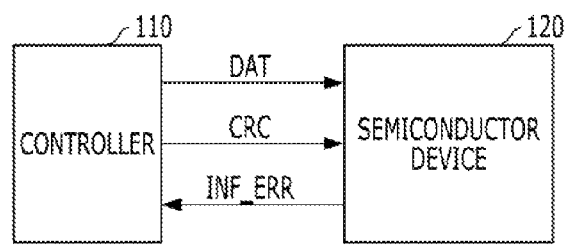
FIG. 1 is a block diagram illustrating a conventional semiconductor device.

Exemplary embodiments of the present invention will be described below in more detail with reference to the accompanying drawings. The, present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like parts in the various figures and embodiments of the present invention.

The drawings are not necessarily to scale and in some instances, proportions may have been exaggerated in order to clearly illustrate features of the embodiments. In this specification, specific terms have been used. The terms are used to describe the present invention, and are not used to qualify the sense or limit the scope of the present invention.

It is also noted that in this specification, 'and/or' represents that one or more of components arranged before and after 'and/or' is included. Furthermore, "connected/coupled" refers to one component not only directly coupling another component but also indirectly coupling another component through an intermediate component. In addition, a singular form may include a plural form as long as it is not specifically mentioned in a sentence. Furthermore, 'include/comprise' or 'including/comprising' used in the specification represents that one or more components, steps, operations, and elements exists or are added.

Figure 2:
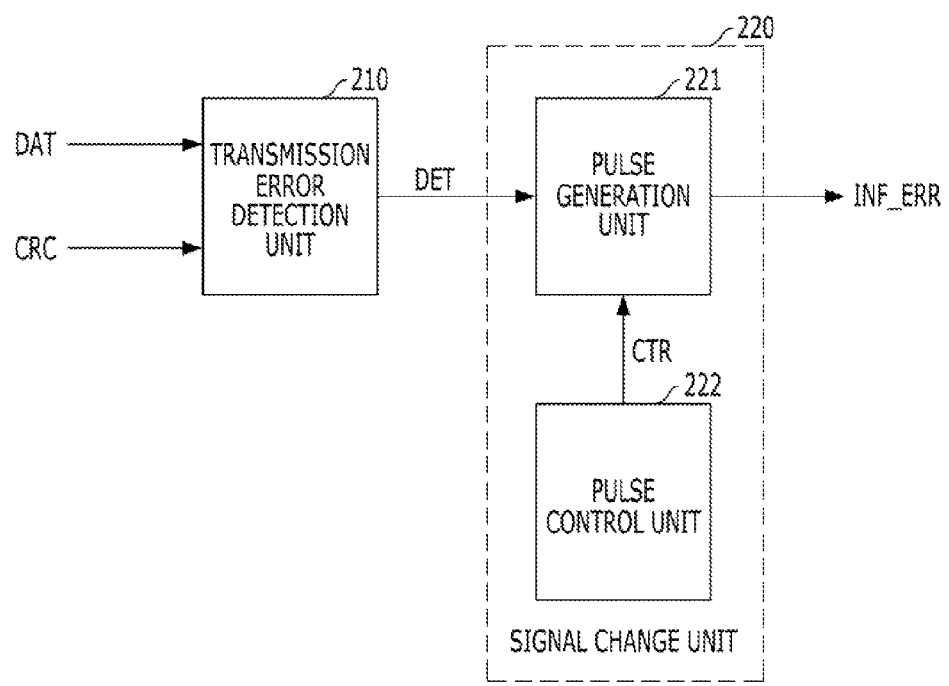
FIG. 2 is a block diagram illustrating a semiconductor device in accordance with an exemplary embodiment of the present invention.

FIG. 2 is a block diagram illustrating a semiconductor device in accordance with an exemplary embodiment of the present invention.

As shown in FIG. 2, the semiconductor device includes a transmission error detection unit 210 and a signal change unit 220.

The transmission error detection unit 210 receives data and a CRC code from an external device (not shown), and generates a detection signal DET. Herein, the detection signal DET is a signal for detecting an error, which occurs in a data transmission.

The signal change unit 220 changes a signal form of error information INF_ERR in response to a detection signal DET. The signal change unit 220 includes a pulse generation unit 221 and a pulse control unit 222. Herein, a signal transmission environment may include a process, a voltage and a temperature, and may further include a loading value of a transmission line for transmitting data.

The pulse generation unit 221 generates the error information INF_ERR in response to the detection signal DET. Herein, the error information INF_ERR may be a pulse signal having a predetermined pulse width, which is generated in response to the detection signal DET.

The pulse control unit 222 generates a control signal CTR based on the signal transmission environment. The control signal CTR is used in changing a signal form of the error information INF_ERR. That is, the control signal CTR is used in changing the pulse width of the error information INF_ERR.

Figure 3:
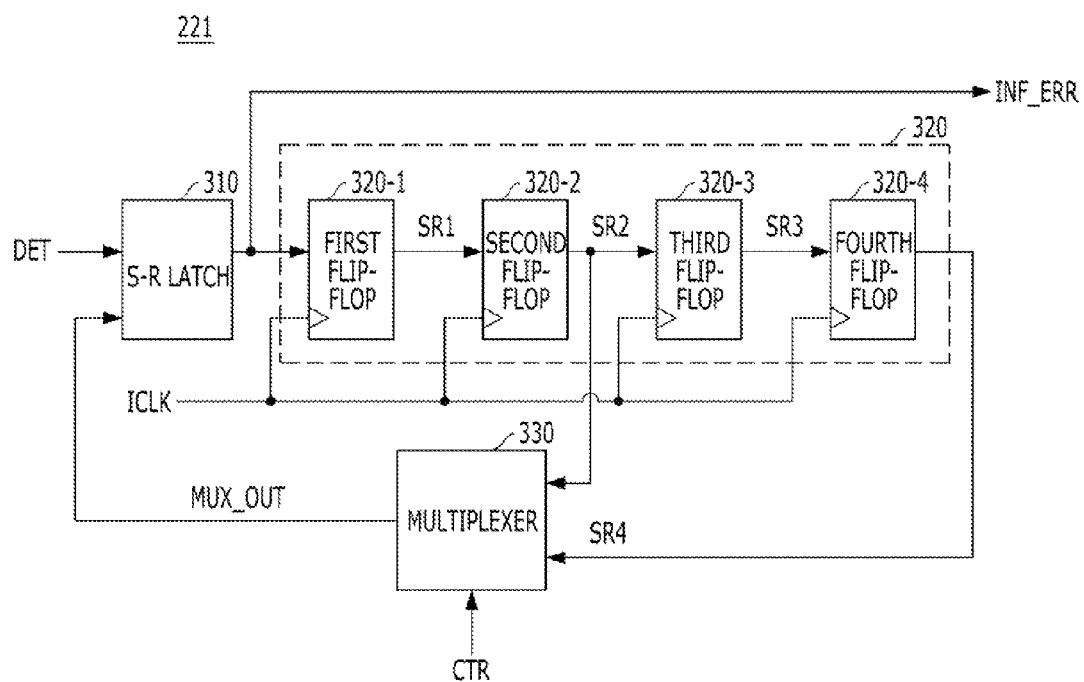
FIG. 3 is a circuit diagram illustrating a pulse generation unit shown in FIG. 2.

FIG. 3 is a circuit diagram illustrating the pulse generation unit included in the signal change unit shown in FIG. 2.

As shown in FIG. 3, the pulse generation unit 221 included in the signal change unit 220 includes an S-R latch 310, a plurality of flip-flops 320, and a multiplexer 330.

The S-R latch 310 generates the error information INF_ERR, which is set in response to the detection signal DET and reset in response to an output signal MUX_OUT of the multiplexer 330.

The flip-flops 320 shifts the error information INF_ERR in response to an internal clock signal ICLK, and includes first to fourth flip-flops 320-1, 320-2, 320-3, and 320-4.

The first flip-flop 320-1 receives the error information INF_ERR and the internal clock signal ICLK, and generates a first output signal SR1 by shifting the error information INF_ERR in synchronization with the internal clock signal ICLK.

The second flip-flop 320-2 receives the first output signal SR1 and the internal clock signal ICLK, and generates a second output signal SR2 by shifting the first output signal SR1 in synchronization with the internal clock signal ICLK.

The third flip-flop 320-3 receives the second output signal SR2 and the internal clock signal ICLK, and generates a third output signal SR3 by shifting the second output signal SR2 in synchronization with the internal clock signal ICLK.

The fourth flip-flop 320-4 receives the third output signal SR3 and the internal clock signal ICLK, and generates a fourth output signal SR4 by shifting the third output signal SR3 in synchronization with the internal clock signal ICLK.

The multiplexer 330 selects one of the second and fourth output signals SR2 and SR4 from the second and fourth flip-flops 320-2 and 320-4 and outputs the output signal MUX_OUT to the S-R latch 310 in response to the control signal CTR.

Figure 4:
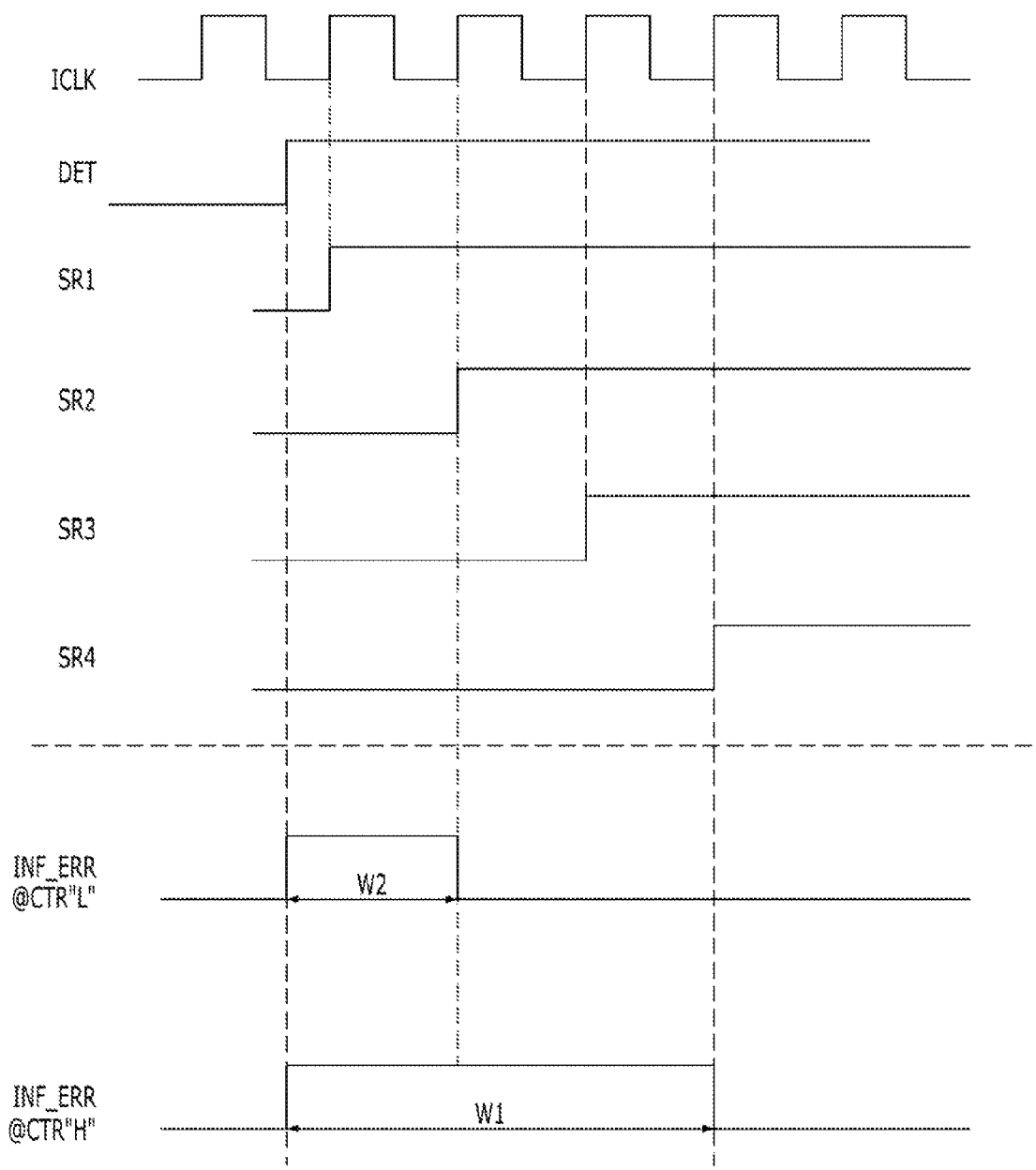
FIG. 4 is a timing diagram illustrating an operation of the pulse generation unit shown in FIG. 3.

FIG. 4 is a timing diagram illustrating an operation of the pulse generation unit shown in FIG. 3. FIG. 4 shows the internal clock signal ICLK, the detection signal DET, the first to fourth output signals SR1, SR2, SR3 and SR4 of the first to fourth flip-flops 320-1 to 320-4, and the error information INF_ERR in response to the control signal CTR.

As shown in FIG. 4, when the detection signal DET is activated, the S-R latch 310 sets the error information INF_ERR, and the flip-flops 320 shift the error information INF_ERR in response to the internal clock signal ICLK.

In detail, the first flip-flop 320-1 shifts the error information INF_ERR in synchronization with the internal clock signal ICLK and generates the first output signal SR1. The second flip-flop 320-2 shifts the first output signal SR1 in synchronization with the internal clock signal ICLK, and generates the second output signal SR2. The third flip-flop 320-3 shifts the second output signal SR2 in synchronization with the internal clock signal ICLK, and generates the third output signal SR3. The fourth flip-flop 320-4 shifts the third output signal SR3 in synchronization with the internal clock signal ICLK, and generates the fourth output signal SR4.

Subsequently, a pulse width of the error information INF_ERR is determined in response to the control signal CTR. Herein, the control signal CTR of a logic low value (@CTR"L") represents that the error information INF_ERR may be sufficiently transmitted. Especially, if the control signal CTR has a logic low value (@CTR"L"), the multiplexer 330 selects the second output signal SR2. Accordingly, the S-R latch 310 sets the error information INF_ERR in response to the detection signal DET, and resets the error information INF_ERR in response to the second output signal SR2.

Further, the control signal CTR of a logic high value (@CTR"H"), represents that the error information INF_ERR may not be sufficiently transmitted. Especially, if the control signal CTR has a logic high value (@CTR"H"), the multiplexer 330 selects the fourth output signal SR4. Accordingly, the S-R latch 310 sets the error information INF_ERR in response to the detection signal DET, and resets the error information INF_ERR in response to the fourth output signal SR4.

As shown in FIG. 4, a pulse width W1 of the error information INF_ERR in case of the control signal CTR having the logic high value (@CTR"H") is wider than a pulse width W2 of the error information INF_ERR in case of the control signal CTR having the logic low value (@CTR"L"). That is, in the exemplary embodiment of the present invention, the pulse width of the error information INF_ERR may be controlled in response to the control signal CTR based on a transmission environment.

As shown in FIG. 4, two output signals of four flip-flops are used in the exemplary embodiment of the present invention. However, in another embodiment of the present invention, a pulse width of the error information INF_ERR may be variously adjusted. That is, the pulse width of the error information INF_ERR may be variously changed based on a signal transmission environment.

In order to perform an above-mentioned variable operation, the control signal CTR for reflecting a state of the signal transmission environment is requested. The control signal CTR may be used to select output signals of a plurality of flip-flops. This may control a reset timing of the error information INF_ERR. That is the pulse width of the error information INF_ERR may be controlled based on the state of the signal transmission environment.

As described above, the semiconductor device in accordance with the exemplary embodiment of the present invention may detect an error, which occur in a data transmission, and change a signal form of the error information INF_ERR based on a signal transmission environment. For example, if the error information INF_ERR has a signal having a pulse width, in the embodiment of the present invention, the semiconductor device may control the error information INF_ERR to be transmitted to a target circuit by increasing the pulse width of the error information INF_ERR.

Figure 5:
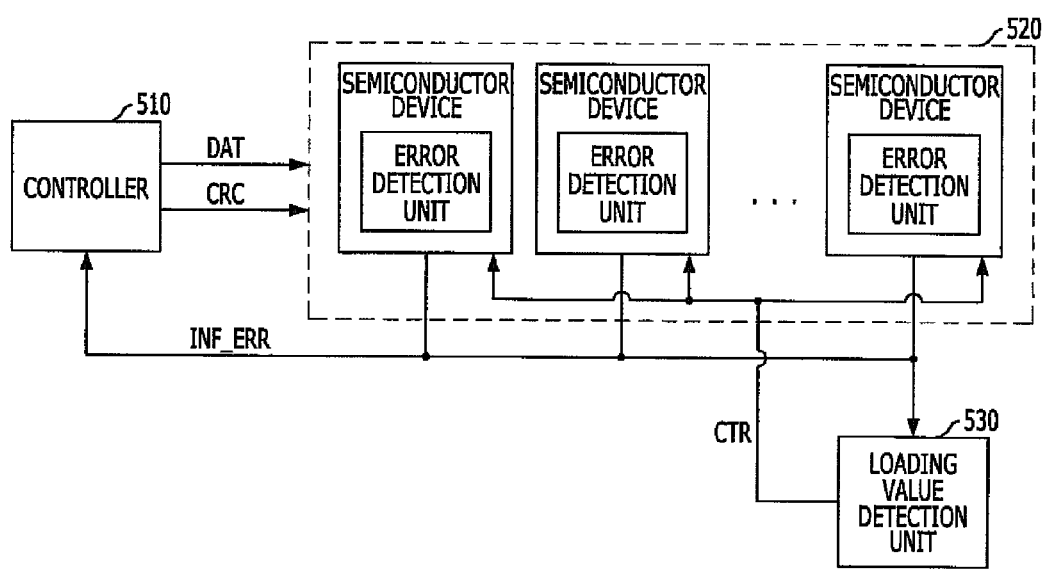
FIG. 5 is a block diagram illustrating a semiconductor system in accordance with an exemplary embodiment of the present invention.

FIG. 5 is a block diagram illustrating a semiconductor system in accordance with an exemplary embodiment of the present invention.

As shown in FIG. 5, the semiconductor system in accordance with the exemplary embodiment of the present invention includes a controller 510, a plurality of semiconductor devices 520, and a loading value detection unit 530.

The controller 510 transmits data DTA and a CRC code to the semiconductor devices 520.

The semiconductor devices 520 receive the data DTA and the CRC code from the controller 510, detect an error, which occur in a data transmission, and output error information INF_ERR. Herein, the error information INF_ERR is transmitted to the controller 510 through a common transmission line coupled to the semiconductor devices 520. The controller 510 determines a re-transmission based on the error information INF_ERR.

Herein, each of the semiconductor devices 520 may include the transmission error detection unit 210 and the pulse generation unit 221 included in the signal change unit 220 shown in FIGS. 2 and 3, and the error information INF_ERR may be a pulse signal.

Especially, the pulse width of the error information INF_ERR may be adjusted using a control signal CTR generated by the loading value detection unit 530. Moreover since the semiconductor devices 520 are coupled to a common transmission line, the error information INF_ERR corresponding to each of the semiconductor devices 520 may be sequentially transmitted to the controller 510 without any conflict.

The loading value detection unit 530 generates the control signal CTR by detecting a loading value of the common transmission line. The control signal CTR is inputted to the semiconductor devices 520. The semiconductor devices 520 change a signal form of the error information INF_ERR in response to the control signal CTR.

If the loading value of the common transmission line is greater than a predetermined loading value, the control signal CTR having this information is transmitted to the semiconductor devices 520.

Each of the semiconductor devices 520 may adjust the pulse width of the error information INF_ERR in response to the control signal CTR. Herein, a large loading value represents that the signal transmission environment is poor. The pulse width of the error information INF_ERR may be controlled to be widened in response to the control signal CTR.

The semiconductor system in the exemplary embodiment of the present invention detects the loading value of the common transmission line and adjusts the pulse width of the error information INF_ERR based on a detected result. A correct information transmission may be performed by adjusting the pulse width of the error information INF_ERR.

Figure 6:
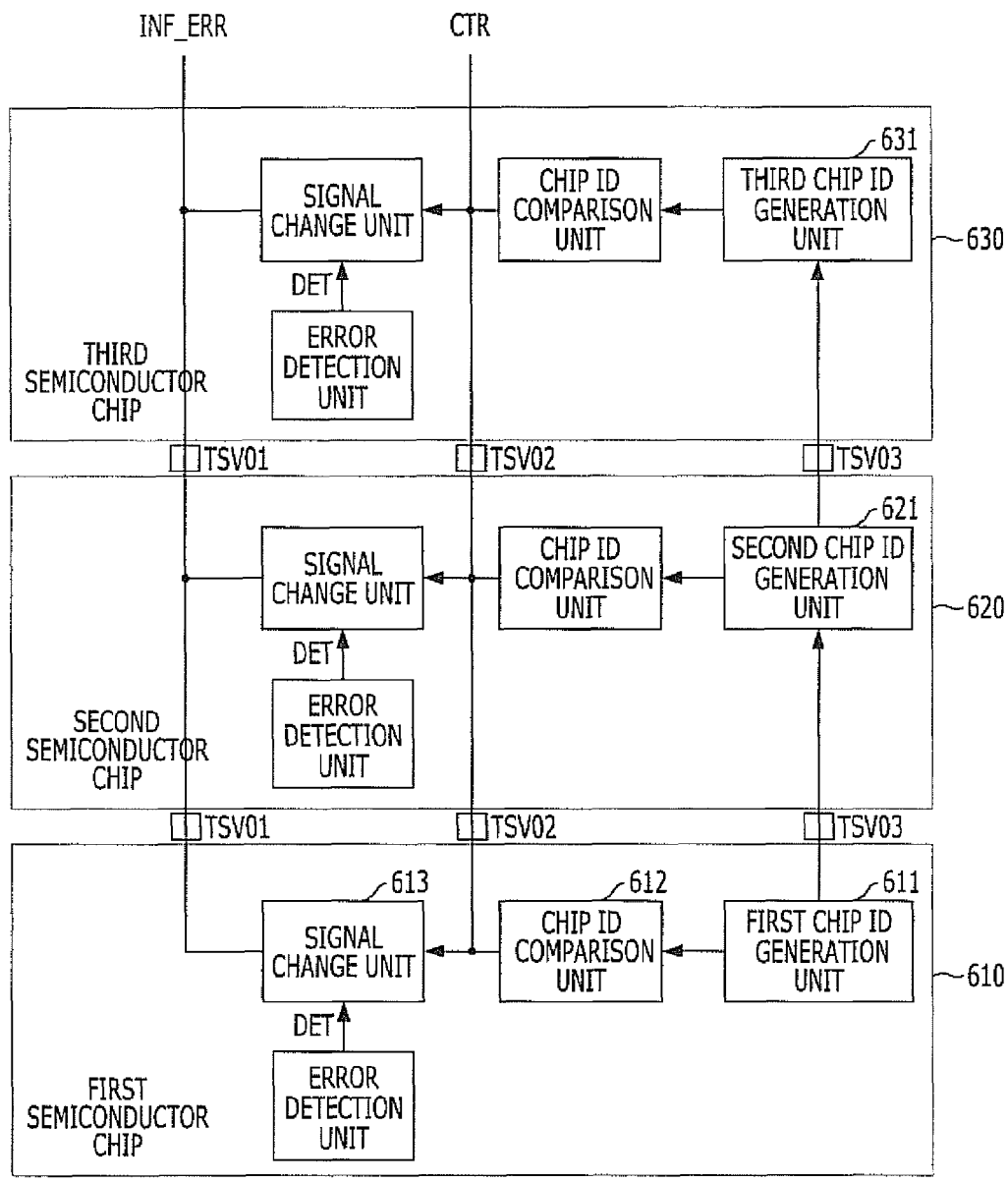
FIG. 6 is a block diagram illustrating a multichip package in accordance with an exemplary embodiment of the present invention.

FIG. 6 is a block diagram illustrating a multichip package in accordance with an exemplary embodiment of the present invention. In FIG. 6, first to third semiconductor chips 610, 620 and 630 coupled to each other through a through-silicon-via (TSV) are exemplarily described.

As shown in FIG. 6, the multichip package in accordance with the exemplary embodiment of the present invention includes the first to third semiconductor chips 610, 620 and 630.

The first to third semiconductor chips 610, 620 and 630 coupled to each other through a first TSV TSV01 for transferring error information INF_ERR and a second TSV TSV02 for transferring a control signal CTR.

Hereinafter, for the convenience of the descriptions, the first semiconductor chip 610 will be exemplarily described.

The first semiconductor chip 610 is coupled to the second semiconductor chips 620 through the first TSV TSV01 for transferring the error information INF_ERR and the second TSV TSV02 for transferring the control signal CTR, and includes a first chip identification (ID) generation unit 611, a chip ID comparison unit 612, and a signal change unit 613.

The first chip ID generation unit 611 allocates a chip ID to the first semiconductor chip 610.

As shown in FIG. 6, in case that the first semiconductor chip 610 is arranged at a bottom and the third semiconductor chip 630 is arranged at a top, the first chip ID generation unit 611 of the first semiconductor chip 610 allocates a first chip ID corresponding to '1' to the first semiconductor chip 610. A second chip ID generation unit 621 of the second semiconductor chip 620 receives the first chip ID from the first chip ID generation unit 611 through a third TSV TSV03, and allocates a second chip ID corresponding to '2' to the second semiconductor chip 620. A third chip ID generation unit 631 of the third semiconductor chip 630 receives the second chip ID from the second chip ID generation unit 621 through the third TSV TSV03, and allocates a third chip ID corresponding to '3' to the third semiconductor chip 630.

A chip ID comparison unit 612 compares a predetermined chip ID with the first chip ID generated by the first chip ID generation unit 611, and generates the control signal CTR. Herein, the control signal CTR is transmitted to the second semiconductor device 620 and the third semiconductor device 630 through the second TSV TSV02. The predetermined chip ID is a reference for adjusting the pulse width of the error information INF_ERR. For example, if the predetermined chip ID is set to '3', the chip ID comparison unit 612 compares the predetermined chip ID corresponding to '3' with the first chip ID corresponding to '1' generated by the first chip ID generation unit 611, and generates the control signal CTR based on a comparison result.

The signal change unit 613 has substantially the same configuration as the pulse generation unit 221 of the signal change unit 220 shown in FIG. 2. Thus, the signal change unit 613 may adjust a pulse width of the error information INF_ERR in response to the control signal CTR generated by the chip ID comparison unit 612. That is, the signal change unit 613 generates the error information INF_ERR having a predetermined pulse width based on a detection signal DET, and controls the pulse width of the error information INF_ERR in response to the control signal CTR. Herein, the control signal CTR is transferred to the first to third semiconductor chips 610 to 630 through the second TSV TSV02, and the detection signal DET may be generated based on data and a CRC code from an external device (not shown).

Hereinafter, the predetermined chip ID will be described in details as below.

A multichip package includes a plurality of stacked semiconductor chips, which are coupled to each other through a TSV. Thus, as the number of stacked semiconductor chips increases, a loading of the TSV increases.

The exemplary embodiment of the present invention shown in FIG. 5 illustrates a case that the loading value of the common transmission line is directly detected. The exemplary embodiment of the present invention shown in FIG. 6 illustrates a case that the loading value of the TSV is indirectly detected using the chip ID.

For example, if the loading value of the TSV in at least three stacked semiconductor chips is larger than a predetermined loading value, the predetermined chip ID is set to '3'. That is, the predetermined chip ID is set to '3' in the chip ID comparison unit of each of the first to third semiconductor chips 610, 620 and 630.

Subsequently, after the first to third semiconductor chips 610, 620 and 630 are stacked, the first to third chip IDs corresponding to the first to third semiconductor chips 610, 620 and 630 are allocated by the first to third chip ID generation unit 611, 621 and 631, respectively. As described above, the first chip ID corresponding to '1' is allocated to the first semiconductor chip 610. The second chip ID corresponding to '2' is allocated to the second semiconductor chip 620. The third chip ID corresponding to '3' is allocated to the third semiconductor chip 630.

Meanwhile, the chip ID comparison unit of the third semiconductor chip 630 compares the predetermined chip ID having '3' with the third chip ID having '3' allocated to the third semiconductor chip 630, and outputs the control signal CTR based on a comparison result. The control signal CTR is transmitted to the signal change unit of each of the first to third semiconductor chips 610, 620 and 630. The pulse width of the error information INF_ERR is controlled to be widened more than a predetermined width in response to the control signal CTR.

A multichip package in accordance with the exemplary embodiment of the present invention detects a loading value of a TSV for transferring error information INF_ERR using a chip ID, and adjusts a pulse width of the error information INF_ERR based on a detected result.

As described above, in exemplary embodiments of the present invention, since the signal form of the error information INF_ERR may be changed based on a signal transmission environment, it is possible to prevent the error information INF_ERR from being lost. Thus, a correction operation may be performed based on error information INF_ERR.

In exemplary embodiments of the present invention, to change the signal form of the error information INF_ERR by adjusting the pulse width of the error information INF_ERR is exemplarily described However, the present invention may include a method for changing a signal form of the error information by adjusting the drivability of a driving circuit, which outputs the error information INF_ERR.

In exemplary embodiments of the present invention, the semiconductor device, the semiconductor system and the multichip package detect an error to be occurred in a signal transmission, and transmit a detected result to a target circuit or device, and may increase reliability of a complementary operation in the error detection.

While the present invention has been described with respect to the specific embodiments, it will be apparent to those skilled in the art that various changes and modifications may be made without departing from the spirit and scope of the invention as defined in the following claims.

What is claimed is:

1. A semiconductor device comprising:
   an error detection unit suitable for receiving data and a cyclic redundancy check (CRC) code, and for outputting a detection signal by detecting a transmission error of the data, wherein the detection signal is a signal for detecting an error, which occurs in a data transmission; and
   a signal change unit suitable for generating error information based on the detection signal while changing the error information based on a signal transmission environment of the data.

2. The semiconductor device of claim 1, wherein the signal change unit comprises:
   a pulse generation unit suitable for generating the error information having a predetermined pulse width in response to the detection signal; and
   a control signal generation unit suitable for controlling the pulse width of the error information based on the signal transmission environment.

3. The semiconductor device of claim 1, wherein the signal transmission environment includes a process, a voltage, and a temperature.

4. A semiconductor system comprising:
   a plurality of semiconductor devices suitable for receiving data and a cyclic redundancy check (CRC) code corresponding to the data, for detecting a transmission error of the data, and for generating error information;
   a controller suitable for providing the data and the CRC code to the semiconductor devices, for receiving the error information through a common transmission line, and for re-transmitting the data; and
   a loading value detection unit suitable for detecting a loading value of the common transmission line, and for generating a control signal based on the detected loading value of the common transmission line,
   wherein each of the semiconductor devices changes the error information in response to the control signal.

5. The semiconductor system of claim 4, wherein each of the semiconductor devices comprises:
   an error detection unit suitable for receiving the data and the CRC code, and for outputting a detection signal by detecting the transmission error of the data; and
   a pulse generation unit suitable for generating the error information based on the detection signal while changing the error information in response to the control signal.

6. The semiconductor system of claim 5, wherein the error information includes a pulse signal.

7. The semiconductor system of claim 6, wherein the pulse generation unit adjusts a pulse width of the error information in response to the control signal.

8. The semiconductor system of claim 7, wherein, when a loading value of the common transmission line is greater than a predetermined loading value, the pulse width of the error information is widened more than a predetermined pulse width.

9. The semiconductor system of claim 4, the error information corresponding to each of the semiconductor devices is sequentially transmitted through the common transmission line.

10. A multichip package having a plurality of semiconductor chips coupled to through-silicon-vias (TSVs), each semiconductor chip comprising:
   an error detection unit suitable for receiving data and a cyclic redundancy check (CRC) code, and for outputting a detection signal by detecting a transmission error of the data, wherein the detection signal is a signal for detecting an error, which occurs in a data transmission;
   a chip identification (ID) generation unit suitable for generating a chip ID corresponding to each semiconductor chip;
   a chip ID comparison unit suitable for generating a control signal by comparing a predetermined chip ID with the chip ID generated by the chip ID generation unit; and
   a pulse generation unit suitable for generating error information based on the detection signal while changing the error information in response to the control signal representing a signal transmission environment of the data.

11. The multichip package of claim 10, wherein the number of the chip IDs of the semiconductor chips corresponds to the number of the semiconductor chips, and the predetermined chip ID is preset irrespective of the number of the semiconductor chips.

12. The multichip package of claim 10, wherein the error information is transmitted through a first TSV.

13. The multichip package of claim 10, wherein the error information is a pulse signal.

14. The multichip package of claim 13, wherein the pulse generation unit adjusts a pulse width of the error information in response to the control signal.

15. The multichip package of claim 10, further comprising:
   a second TSV suitable for transferring the control signal to each of the semiconductor chips.

* * * * *